United States Patent [19]

Katoh et al.

[11] 4,037,168
[45] July 19, 1977

[54] TRANSISTORIZED UHF POWER AMPLIFIER COMPRISING A FERROELECTRIC SHEET BETWEEN A CONDUCTIVE BASE PLATE AND A CONDUCTIVE PATTERN

[75] Inventors: Hidehiko Katoh; Yuji Kajiwara; Hideo Takamizawa, all of Tokyo, Japan

[73] Assignee: Nippon Electric Company Limited, Tokyo, Japan

[21] Appl. No.: 721,756

[22] Filed: Sept. 9, 1976

[30] Foreign Application Priority Data

Sept. 10, 1975  Japan ................... 50-110200

[51] Int. Cl.² .......................... H03F 3/04; H03F 3/60
[52] U.S. Cl. ........................................ 330/31; 330/53; 333/73 S; 333/84 M
[58] Field of Search ................... 330/21, 31, 38 M, 53; 333/73 S, 84 M

[56] References Cited
U.S. PATENT DOCUMENTS 4,001,711  1/1977  Knutson et al. .................. 330/31 X

*Primary Examiner*—James B. Mullins
*Attorney, Agent, or Firm*—Hopgood, Calimafde, Kalil, Blaustein and Lieberman

[57] ABSTRACT

As an input and/or an output matching circuit for a transistor, a transistorized high-frequency power amplifier comprises at least one pattern of a conductive material on a sheet of a ferroelectric material placed on a conductive base plate in direct contact therewith. The ferroelectric material is represented by the formula:

$$(1 - x) BaO.xTiO_2,$$

where $0.7 \leq x < 1.0$. Preferably, $x \leq 0.95$. The pattern may be in direct contact with the ferroelectric sheet to form a capacitor together with the base plate, a quarter-wavelength impedance transformer, or both. Preferably, the pattern is formed by integrated circuit techniques. An inductor may preferably be provided either by a portion of the pattern with a conventional dielectric material substituted for the ferroelectric material at that part of the sheet which is below the pattern portion or by a chip inductor.

7 Claims, 5 Drawing Figures

TRANSISTORIZED UHF POWER AMPLIFIER COMPRISING A FERROELECTRIC SHEET BETWEEN A CONDUCTIVE BASE PLATE AND A CONDUCTIVE PATTERN

BACKGROUND OF THE INVENTION

This invention relates to a transistorized high-frequency power amplifier, which may be for a UHF television satellite transmission station.

As a consequence of technical progress in high-frequency high-power transistors, approaches have been made to realizing a high-frequency power amplifier with a solid-state circuit. By way of example, a solid-state UHF power amplifier comprising a dozen or more transistors, each having a saturated output of the order of 20 watts, has been developed for a UHF television satellite transmission station of the output power of several hundred watts.

The high-frequency high-power transistors, however, have in general a very low input impedance. It is therefore difficult to realize a wide-band matching circuit for the transistor. For example, the risistance component of the input impedance is generally only a few ohms or less. As a result, even a small reactance component may inevitably render the Q value of the matching circuit unduly high. As a further result, a solid-state high-frequency power amplifier has but a restricted operable bandwidth.

On the other hand, the matching circuit must have a large impedance transformation or conversion ratio due to the small input impedance of the transistor. As a result, use has to be made either of a line of a very small impedance or a capacitor of a very large capacitance. It has, however, been impossible to form such a matching circuit by conventional integrated circuit techniques, such as hybrid integrated circuit techniques, wherein use is made of a microstrip line on an alumina or a similar dielectric layer and a chip capacitor. In particular, the wavelength of a UHF signal in the microstrip line is as long as several scores of centimeters. This makes it necessary to resort at least partly to a lumped constant circuit element. A thin-film integrated circuit element is also insufficient to achieve a desired circuit constant and desired high-frequency characteristics. Moreover, it has been impossible to reduce the high-frequency loss of the dielectrics with a view to suppressing heat generation in the high-frequency circuit and to reduce the temperature dependency of the dielectric constant with a view to suppressing changes caused in the circuit characteristics by a transistor or a like active circuit element put in operation. A conventional transistorized high-frequency high-power amplifier has therefore been bulky, expensive, and yet unreliable.

SUMMARY OF THE INVENTION

It is therefore an object of the present invention to provide a transistorized power amplifier having a broad operable bandwidth.

It is another object of this invention to provide a transistorized high-frequency power amplifier of the type described, which is compact.

It is still another object of this invention to provide a transistorized high-frequency power amplifier of the type described, for which temperature dependency of the characteristics is reduced to raise the reliability.

It is yet another object of this invention to provide a transistorized high-frequency power amplifier of the type described, wherein it is possible to manufacture an input and/or an output matching circuit for a power transistor by integrated circuit techniques to reduce the cost of manufacture.

A transistorized high-frequency power amplifier according to this invention comprises an electroconductive base plate, a power transistor thereon, at least one pattern of an electroconductive material operatively connected to the transistor, and a dielectric sheet below the pattern in direct contact with the base plate, and is characterized in that the dielectric sheet is of a ferroelectric material represented by the formula:

$$(1 - x)BaO.xTiO_2,$$

where $x$ represents a constant that is not less than about 0.7 and that is less than 1.0.

Incidentally, a device using a low-loss dielectric material which may be represented by the formula:

$$(1 - x)BaO.xTiO_2,$$

where $x$ is a constant between 0.81 and 0.82 is disclosed in U.S. Pat. No. 3,938,064 issued Feb. 10, 1976, to H. M. O'Bryan, Jr et al, assignors to Bell Telephone Laboratories, Inc. The low-loss dielectric material, however, is used to provide a dielectric resonator. A strip line is formed on a ceramic substrate. O'Bryan, Jr et al therefore does not teach a filter comprising a conductive base plate, a sheet of the above-defined ferroelectric material thereon, and a conductive pattern on the ferroelectric sheet.

DESCRIPTION OF THE PREFERRED EMBODIMENTS

For convenience of description, dielectric constants $\epsilon$ of a material represented by the formula:

$$(1 - x)BaO.xTiO_2,$$

where $x$ represents a constant, are given at first in Table 1. Table 1 also gives $\tan\delta$ and the temperature coefficient $\alpha$ of the dielectric constant in a temperature range between $-20°$ and $60°$ C. The dielectric constant was measured at 1 MHz and in the X band. The values of $\tan\delta$ and temperature coefficient were measured in the X band. Samples were of a circular disk shape and are numbered from 1 to 9 according to various values of the constant $x$.

Table 1

| Sample No. | x | ε 1 MHz | X band | tan δ | α |
|---|---|---|---|---|---|
| 1 | 0.60 | 1018 | 200 | 0.01 | −420±55 |
| 2 | 0.70 | 132 | 75 | 0.0008 | −105±21 |
| 3 | 0.74 | 51.9 | 52.5 | 0.00024 | −80±10 |
| 4 | 0.80 | 37.9 | 37.3 | 0.00014 | −26± 4 |
| 5 | 0.808 | 39.2 | 38.8 | 0.00012 | −15± 4 |
| 6 | 0.818 | 37.8 | 38.0 | 0.00014 | −3± 3 |
| 7 | 0.868 | 51.2 | 51.5 | 0.00019 | −120±35 |
| 8 | 0.900 | 62.3 | 61.2 | 0.00022 | −340±42 |
| 9 | 0.950 | 78.0 | 76.3 | 0.0012 | −419±63 |

For comparison with the ferroelectric material, the dielectric constant $\epsilon$, $\tan\delta$, and the temperature coefficient $\alpha$ of alumina generally used as a dielectric material are given in Table 2 together with the linear expansion coefficient $\beta$ in ppm/°C. The temperature coefficient $\alpha$ is defined by:

$$\alpha = \frac{\Delta\epsilon}{\epsilon} \cdot \frac{1}{\Delta T}$$

and given in Tables 1 and 2 in ppm/°C. It is clear from Tables 1 and 2 that the material given in Table 1 is an excellent ferroelectric material when the constant $x$ is about 0.7 or more.

Table 2

| | alumina (99°/o) | Sample No. 5 |
|---|---|---|
| ε | 9.3 | 39.2 |
| tan Δ | 0.0003 | 0.00012 |
| α | +130±10 | −15±4 |
| β | +6.5 | +8.0 |

When the constant $x$ is less than about 0.7, the material has an objectionably large $\tan\delta$. When the constant $x$ reaches 1.0, the temperature coefficient $\alpha$ becomes unduly large. It has therefore been decided that the constant $x$ should not be less than about 0.7 and less than 1.0. As shown in Table 1, the upper limit of the constant $x$ is preferably about 0.95. The dielectric constant was measured also at 400 MHz by the slot-line technique and found to be approximately equal to the value measured in the X band.

Figure 1:
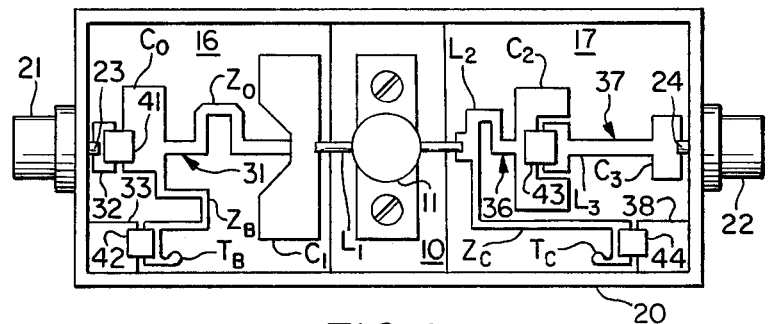
FIG. 1 is a schematic plan view of a transistorized high-frequency power amplifier according to a first embodiment of the present invention.
Figure 2:
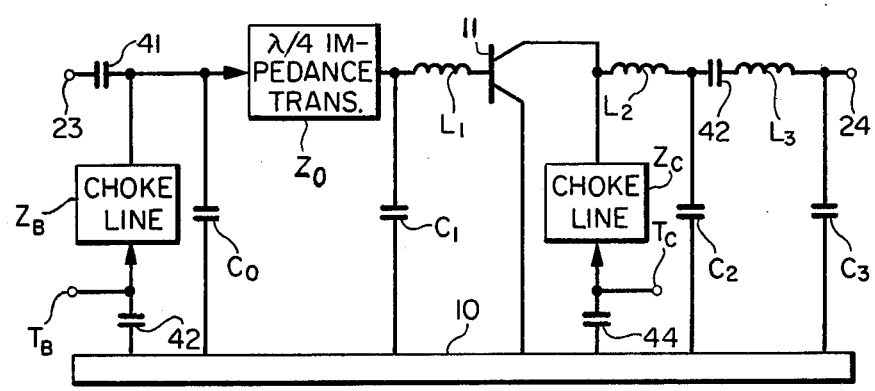
FIG. 2 shows an equivalent circuit of the amplifier depicted in FIG. 1.

Referring now to FIGS. 1 and 2, a transistorized high-frequency power amplifier according to a first embodiment of the present invention comprises an electroconductive base plate 10, a UHF power transistor 11 mounted thereon, and a first and a second sheet 16 and 17 on both sides of the transistor 11 and in direct contact with the base plate 10. The sheets 16 and 17 are 0.5 mm thick and made of a ferroelectric material for the sample No. 5. The base plate 10 is bent and extended along side edges of the sheets 16 and 17 to serve as a casing 20 of the amplifier. A first and a second coaxial connector 21 and 22 having central conductors 23 and 24, respectively, are attached to the casing 20. A first continuous pattern 31, an input pattern 32, and a first grounding pattern 33 are formed on the first sheet 16 by integrated circuit techniques. Similarly, a second and a third continuous pattern 36 and 37 and a second grounding pattern 38 are formed on the second sheet 17. Each of the patterns 31-33 and 36-38 may comprise thin evaporated layers of chromium and copper and a thin plated layer of gold successively on the sheet 16 or 17. The grounding patterns 33 and 38 are electrically connected to the base plate 10. The central conductors 23 and 24 of the connectors 21 and 22 are brought into electrical contact with the input pattern 32 and the third continuous pattern 37. As shown, base and collector electrodes of the transistor 11 are electrically connected to the first and second continuous patterns 31 and 36. The first continuous pattern 31 serves as a base quarter-wavelength choke line $Z_B$ having a base terminal $T_B$, one electrode of an adjusting capacitor $C_0$, a quarter-wavelength impedance transformer $Z_0$, one electrode of a first capacitor $C_1$, and a first inductor $L_1$. The second continuous pattern 36 serves as a collector quarter-wavelength choke line $Z_0$ having a collector terminal $T_C$, a second inductor $L_2$, and one electrode of a second capacitor $C_2$. The third continuous pattern 37 serves as a third inductor $L_3$ and one electrode of a third capacitor $C_3$. In the example being depicted, the first inductor $L_1$ is provided by the base lead of the transistor 11. The first through third inductor-capacitor pairs serve as low-pass filters. Chip capacitors 41, 42, 43, and 44 are connected between the input pattern 32 and the impedance transformer $Z_0$, between the base terminal $T_B$ and ground, between the second and third low-pass filters, and between the collector terminal $T_C$ and ground.

Let it now be presumed that the transistor 11 is a UHF transistor CD1933 of a 20-watt output manufactured and sold by Communications Transistor Corporation, California, and that the amplifier is for a frequency band having a center at 600 MHz and a specific bandwidth of about 40°/o. Resistance components of the transistor input and output impedances are 1.25 and 3.3 ohms, respectively. An input and an output matching circuit for transforming the input and output impedances to 50 ohms should have the following circuit constants:

$L_1$: 0.52 nH
$Z_0$: 14 ohms
$C_2$: 43 pF
$C_3$: 11.3 pF
$C_1$: 134 pF
$L_2$: 1.88 nH
$L_3$: 7.3 nH The first and second capacitors $C_1$ and $C_2$ must have large capacitances in order to keep the Q values of the transistor 11 and the first and second inductors $L_1$ and $L_2$ low. It is undesirable to use either a conventional laminated chip capacitor or a conventional thin-film capacitor of this large capacitance because self oscillation has been unavoidable in the UHF band. Moreover, a self inductance of a fraction of nanohenry has been inevitable due to the appreciable dimensions of the capacitor for a high output power. In marked contrast, it is possible with the ferroelectric sheet 16 or 17 to readily provide capacitances of about 70 to 140 pF by the use of a 1-cm² wide electroconductive pattern when the sheet 16 or 17 is 0.5 and 0.25 mm thick, respectively. Furthermore, it has been confirmed that the sheet 16 or 17 well serves as a base sheet of an integrated circuit. Incidentally, the first low-pass filter transforms the input impedance of the transistor 11 to about 4 ohms.

The impedance transformer $Z_0$ often resorted to in a broad-band matching circuit must have a low characteristic impedance of about 14 ohms to further transform the input impedance of the first low-pass filter to the above-mentioned value of 50 ohms. With a conventional alumina sheet, the transformer $Z_0$ must be about 50 mm long in order to be equal in length to a quarter of the wavelength. In contrast, it is possible with a sheet of a ferroelectric material of the sample No. 5 to shorten the transformer $Z_0$ to 25 mm. On the other hand, it has hitherto been very difficult with a conventional alumina sheet of 10 to 20 mm square to realize a characteristic impedance of about 10 ohms.

Table 3

| characteristic impedance | alumina sheet | ferroelectric sheet |
|---|---|---|
| 20 | 2.25 | 0.75 |
| 10 | 5.5 | 2.25 |
| 5 | 10 | 5 |

This would be clear from Table 3 wherein the characteristic impedance is given in ohms and the widths in millimeters are listed for an alumina sheet and a sheet of a ferroelectric material of the sample No. 5, both 0.5 mm thick.

As has been exemplified by an amplifier according to the first embodiment, it is possible in accordance with this invention to provide a capacitor of about 3 to 10 times as large a capacitance and an impedance line of about ⅓ to 1/10 times as narrow an area as those hitherto realized by the use of an alumina or a like dielectric sheet. This invention thus makes it feasible to readily provide a transistorized wide-band UHF power amplifier of reliable performance having an input and/or an output matching circuit realized by an integrated circuit of only a few centimeters in dimensions. It may be mentioned here that the first and second sheets 16 and 17 may be a continuous sheet having provision for grounding a selected electrode, such as an emitter electrode, of the transistor 11 and that the specified ferroelectric material has a sufficient voltage withstanding capability.

Figure 3:
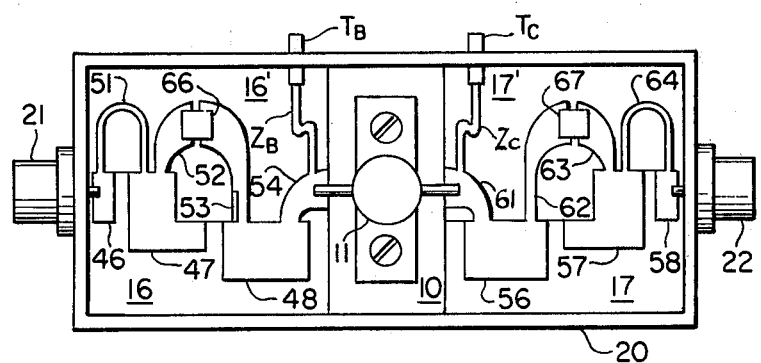
FIG. 3 is a schematic plan view of a transistorized high-frequency power amplifier according to a second embodiment of this invention.

Turning to FIG. 3, a transistorized high-frequency power amplifier according to a second embodiment of this invention comprises an electroconductive base plate 10, a UHF power transistor 11, sheets 16 and 17 of a ferroelectric material defined heretobefore, a casing 20, connectors 21 and 22, and base and collector terminals $T_B$ and $T_C$ as the amplifier illustrated with reference to FIG. 1. The sheets 16 and 17 are, however, extended only about half-way from one side of the casing 20 to the opposite side. A third and a fourth sheet 16' and 17' of a conventional dielectric material, such as alumina or quartz, are disposed directly on the base plate 10 with an edge thereof brought into contact with an edge of the first and second sheets 16 and 17. Capacitor patterns 46, 47, and 48 and inductor patterns 51, 52, 53, and 54 are formed, preferably by the integrated circuit technique, on the first and third sheets 16 and 16' as shown to form a three-stage low-pass input matching circuit. As a three-stage low-pass output matching circuit, capacitor patterns 56, 57, and 58 and inductor patterns 61, 62, 63, and 64 are likewise formed on the second and fourth sheets 17 and 17'. The central conductors of the connectors 21 and 22 and the base and collector electrodes of the transistor 11 are electrically connected to pertinent capacitor and inductor patterns. Base and collector choke lines $Z_B$ and $Z_C$ are formed on the third and fourth sheets 16' and 17' as integral parts of pertinent inductor patterns. Chip capacitors 66 and 67 may be connected to pertinent inductor patterns.

An inductor, such as $L_2$ or $L_3$, of an amplifier according to the first embodiment has an appreciable parallel capacitance to be approximately equivalent to a lumped constant line. In contrast, an inductor provided in an amplifier according to the second embodiment by each of the inductor patterns 51-54 and 61-64 is smaller in size as compared with that provided by a portion of the continuous pattern 31, 36, or 37 directly on the ferroelectric sheet 16 or 17 and has a large impedance with respect to ground and a large Q value. Incidentally, conventional dielectrics have a specific dielectric constant of about 9.

Figure 4:
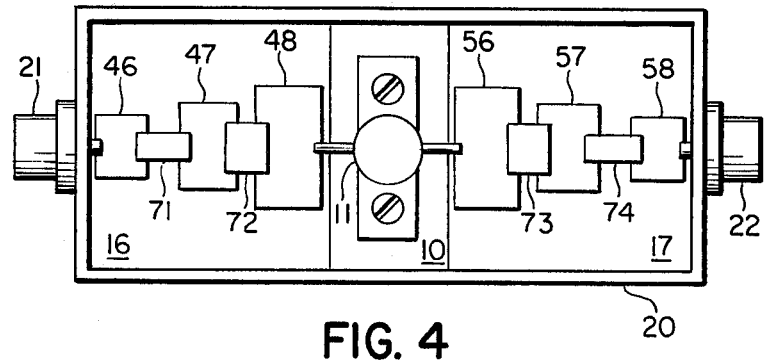
FIG. 4 is a schematic plan view of a transistorized high-frequency power amplifier according to a third embodiment of this invention.
Figure 5:
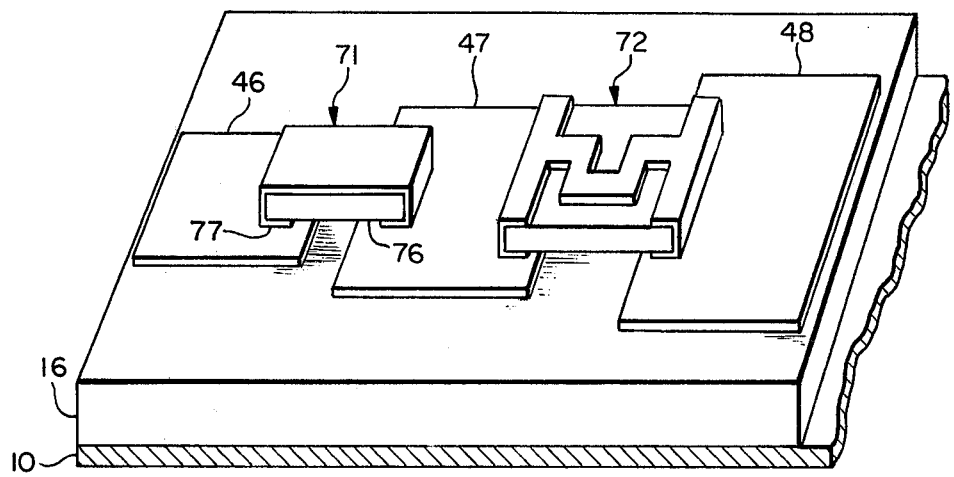
FIG. 5 is an enlarged partial perspective view of the amplifier illustrated in FIG. 4.

Referring finally to FIGS. 4 and 5, a transistorized high-frequency power amplifier according to a third embodiment of this invention comprises similar elements designated by like reference numerals as in FIGS. 1 and 3 except that use is made of chip inductors 71, 72, 73, and 74 connected between the capacitor patterns 46-48 and 56-58. As best shown in FIG. 5, each chip conductor, such as 71, comprises an elongated piece 76 of a conventional dielectric material, such as alumina or quartz, and a metal film 77 on and along lengthwise ends of the dielectric piece 76. As is the case with an amplifier according to the second embodiment, the parastic parallel capacitance of each inductor 71, 72, 73, or 74 is reduced by the dielectric piece 76.

While this invention has thus far been described in specific conjunction with several preferred embodiments thereof, it should clearly be understood that it is possible to carry this invention into effect in various other forms. For example, each of the input and output matching circuits may comprise a quarter-wavelength impedance transformer alone although use is preferred of a parallel capacitor and, for an output matching circuit, also of a series inductor between the capacitor and the collector electrode of the transistor. It is also possible to make either a conductive pattern or a portion of a continuous conductive pattern formed on a sheet of the ferroelectric or conventional dielectric material serve as a resistor.

What is claimed is:

1. In a transistorized high-frequency power amplifier comprising an electroconductive base plate, a power transistor on said base plate, at least one pattern of an electroconductive material operatively connected to said transistor, and a sheet of a material below said pattern in direct contact with said base plate, the improvement wherein said material is a ferroelectric material represented by the formula:

$$(1 - x)BaO.xTiO_2,$$

where x represents a constant that is not less than about 0.7 and that is less than 1.0.

2. A transistorized high-frequency power amplifier as claimed in claim 1, wherein said constant is not greater than about 0.95.

3. A transistorized high-frequency power amplifier as claimed in claim 2, wherein said at least one pattern is formed by integrated circuit techniques.

4. A transistorized high-frequency power amplifier as claimed in claim 2, wherein said pattern is in direct contact with the ferroelectric sheet to serve as a quarter-wavelength impedance transformer connected in series to said transistor and thereby as at least one portion of one of an input and an output matching circuit for said transistor.

5. A transistorized high-frequency power amplifier as claimed in claim 2, wherein said pattern is in direct contact with the ferroelectric sheet, at least a portion of said pattern forming a capacitor together with said base plate, said capacitor being connected in parallel to said transistor to serve as an element of one of an input and an output matching circuit for said transistor.

6. A transistorized high-frequency power amplifier as claimed in claim 5, further comprising a second sheet of a dielectric material directly on said base plate and in contact with said ferroelectric sheet at least at portions of edges of the respective sheets, said dielectric material having a specific dielectric constant of about nine, said at least one pattern being extended onto said second sheet, that portion of said pattern which is extended onto said second sheet serving as an inductor of said one of input and output matching circuit.

7. A transistorized high-frequency power amplifier as claimed in claim 5, further comprising a second pattern of said conductive material directly on said ferroelectric sheet and a chip inductor connecting said at least one pattern and said second pattern, said second pattern forming a second capacitor together with said base plate, said chip inductor comprising a piece of a dielectric material having a dielectric constant of about nine and a metal film on said piece and in electrical contact with said at least one and second patterns.

* * * * *